United States Patent [19]

Hackmeister

[11] 4,027,306
[45] May 31, 1977

[54] TOUCH-RESPONSIVE CIRCUIT AND DATA INPUT TERMINAL USING SAME

[76] Inventor: Richard Hackmeister, 1239 N. Sweetzer, West Hollywood, Calif. 90069

[22] Filed: Apr. 5, 1976

[21] Appl. No.: 673,646

[52] U.S. Cl. .................. 340/365 C; 340/365 S
[51] Int. Cl.² .......................................... G08C 1/00
[58] Field of Search ............................... 340/365 C

[56] References Cited

UNITED STATES PATENTS

| | | | |
|---|---|---|---|
| 3,786,497 | 1/1974 | Davis et al. | 340/365 C |
| 3,846,791 | 11/1974 | Foster | 340/365 C |
| 3,857,100 | 12/1974 | Baars | 340/365 C |
| 3,886,539 | 5/1975 | Gould | 340/365 C |
| 3,971,013 | 7/1976 | Challoner | 340/365 C |

FOREIGN PATENTS OR APPLICATIONS

| | | | |
|---|---|---|---|
| 814,077 | 5/1969 | Canada | 340/365 C |

OTHER PUBLICATIONS

Nick, IBM disclosure Bulletin, vol. 6, No. 4, Sept. 1963, pp. 135, 136.

*Primary Examiner*—Thomas B. Habecker
*Attorney, Agent, or Firm*—Howard A. Silber

[57] ABSTRACT

A touch-responsive circuit uses an ohmic contact connected via a dc blocking capacitor to the high impedance input of an amplifier. A controllable impedance element shunts the capacitor and amplifier input. When the element is in the high impedance state, a weak voltage induced by touching the ohmic contact causes the amplifier to produce an output signal indicative of such touching. Touch response is disabled when the element is in the low impedance state. Advantageously, the controllable impedance element comprises a series-connected pair of diodes that are selectively forward or reverse biased; the element also may comprise an active electronic device such as a transistor.

A data input terminal employs a matrix of ohmic contacts each having an associated touch-responsive circuit. Column scanning is accomplished by conditioning the controllable impedance elements in all but a selected one column to the low impedance state so that touch response is enabled only in that one selected column. The ohmic contacts in each row are connected to a common amplifier for that row. A priority encoder provides an encoded signal designating which amplifier produces a touching-indicative signal, and hence designating which row in the enabled column contains the touched ohmic contact.

16 Claims, 9 Drawing Figures

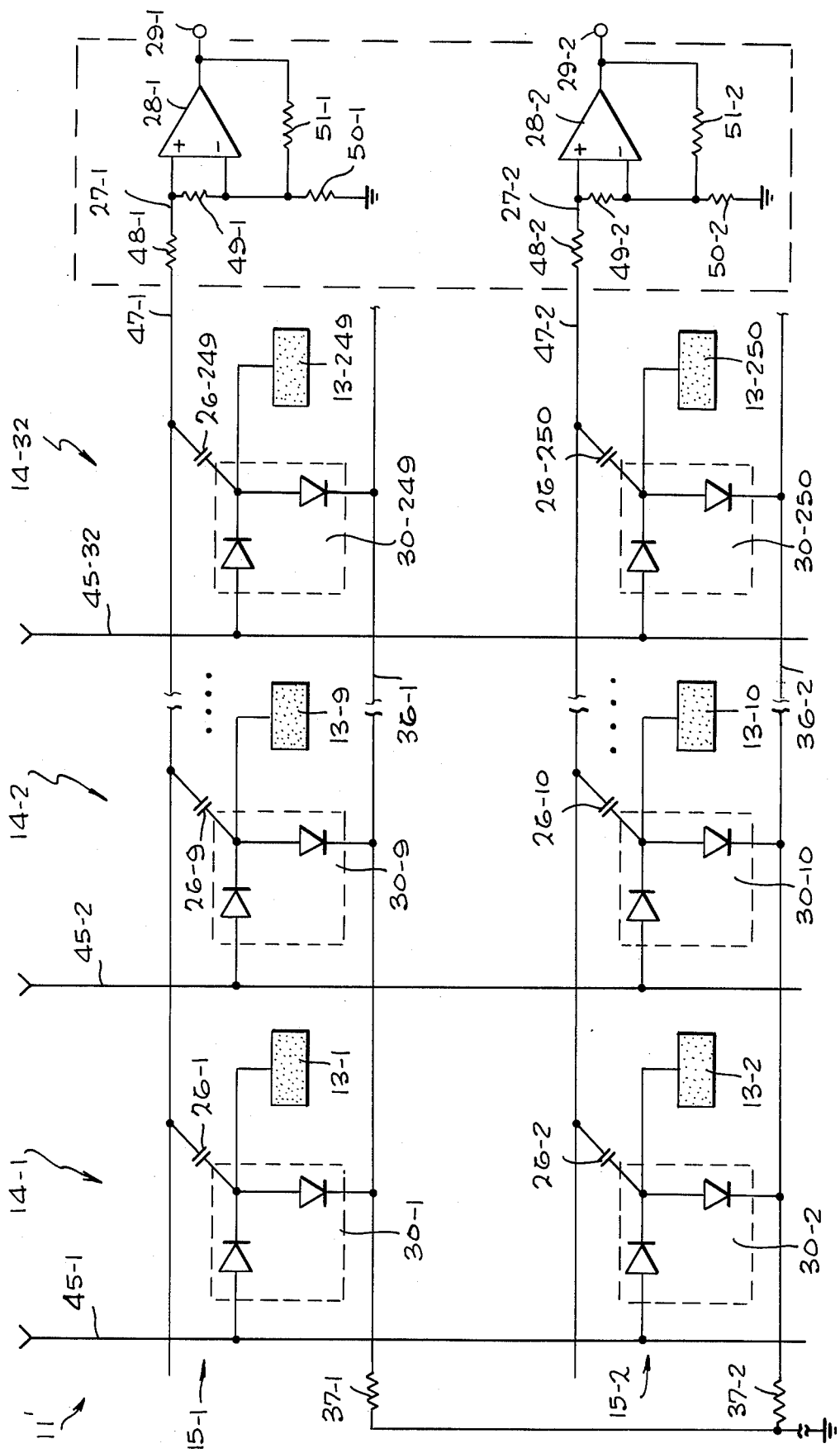

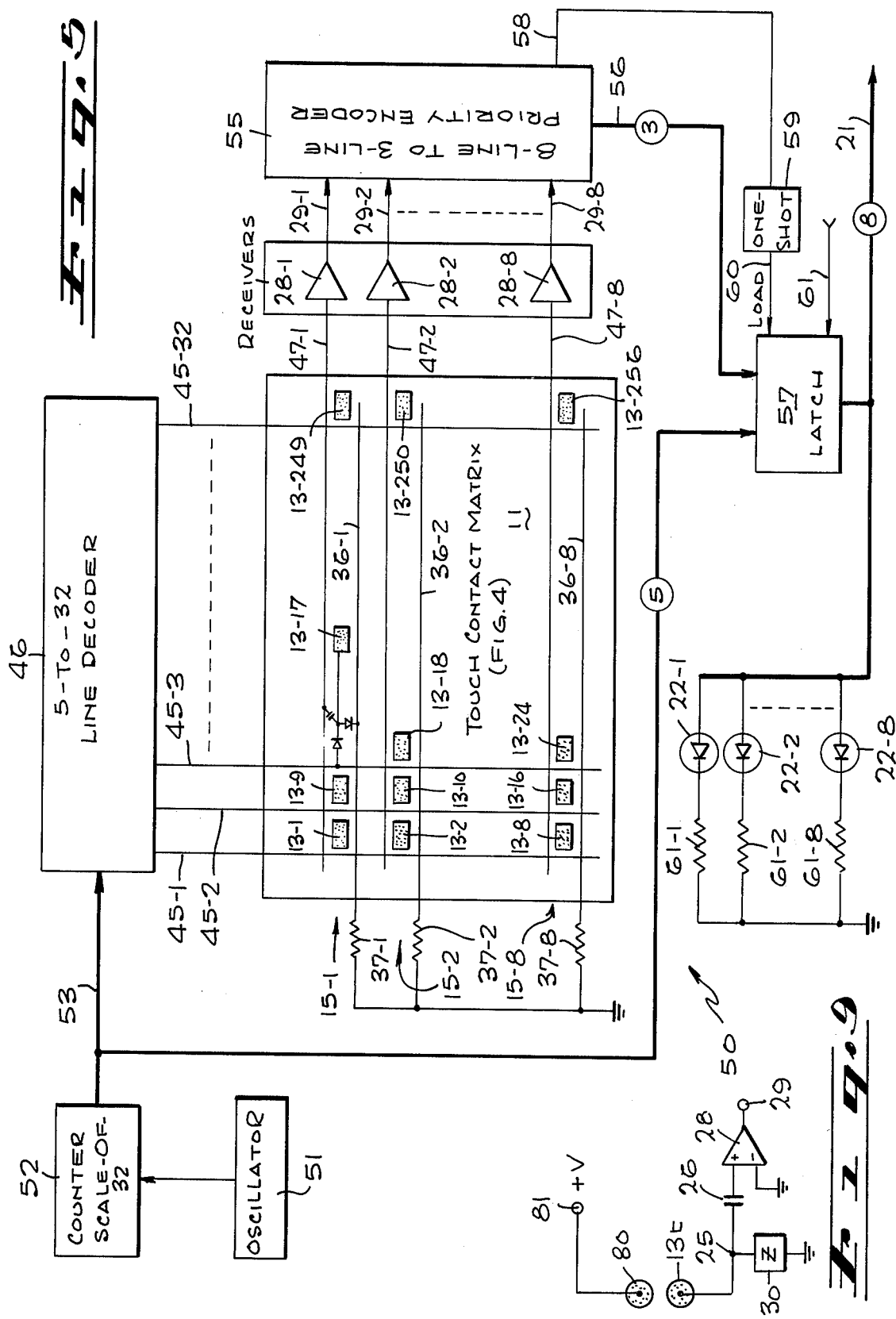

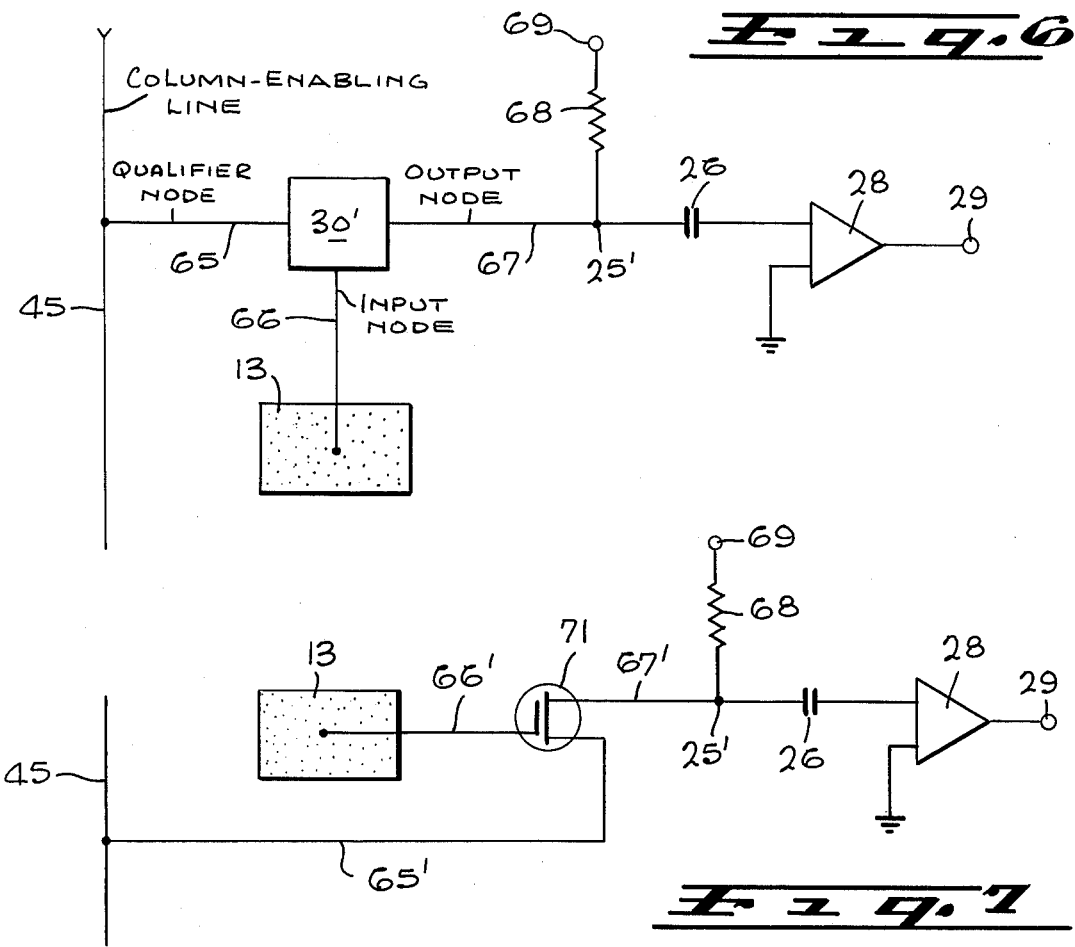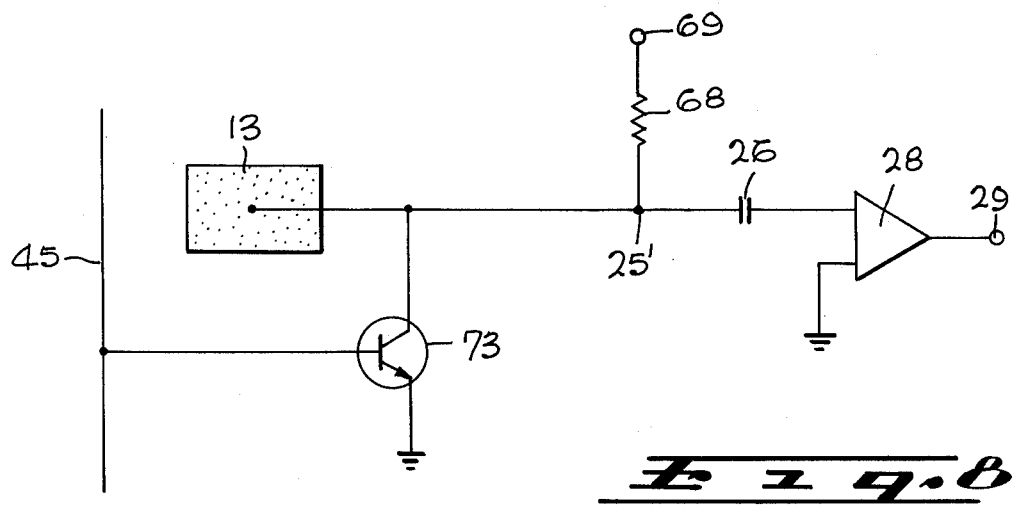

TOUCH-RESPONSIVE CIRCUIT AND DATA INPUT TERMINAL USING SAME

BACKGROUND OF THE INVENTION

1. Field of the Invention

The present invention relates to a touch-responsive circuit and to a data terminal or computer input device utilizing a plurality of such touch-responsive circuits.

2. Description of the Prior Art.

The advent of low cost, large scale integrated circuit microprocessors paves the way for a new generation of consumer products built around such "CPU" (central processing unit) chips. But the commercialization of such consumer products depends on the availability of input devices that can provide a "man-machine interface" at correspondingly low cost. It is a principal object of the present invention to provide such a low cost man-machine interface.

The semiconductor industry now can mass produce very powerful data processors on monolithic substrates. These machines typically embrace a repertoire of 50 to 75 basic instructions and have addressing capability of up to 65,536 memory locations. Today, these CPU chips are predominantly used as components for data processing and test equipment manufactures. But recent improvements in production techniques and yield have brought the volume prices of such CPU chips to well under $25 each. As a result, all of the components (e.g., processor, processing memory, data memory and memory interface) of a sophisticated data processor can be purchased for less than about $100. This price would permit mass production of inexpensive computerized home products, except for the man-machine interface.

Low speed alpha-numeric date input/output to a computer currently is implemented using electro-mechanical equipment such as a teletypewriter. Such equipment employs a complex mechanical typewriter-type keyboard together with a switch arrangement for producing a coded signal designating the selected key. Keyboard simplification generally has involved the use of opto-electronic switching and electronic circuitry to provide the data input codes. But even with these refinements, the cost is prohibitive for most consumer applications.

An object of the present invention is to provide a data input terminal of mechanical simplicity, advantageously having no moving parts. This may be achieved by employing touch-responsive circuits. Another object of the invention is to provide a novel touch-responsive circuit that can be logically enabled or disabled, thereby facilitating the use of such circuits in a scanned array of ohmic "touch" contacts.

Another shortcoming of prior art teletypewriter-type data terminals is that they are intended only for alpha-numeric data input. That is, each key designates a specific alphabetic or numeric character. Graphic input to a computer requires a totally different device, such as an optical document reader or a light-pen used in conjunction with a video display. Such graphic input devices are very costly and complex It is another object of the present invention to provide a low cost data terminal which can be used for both alpha-numeric and graphic data input.

SUMMARY OF THE INVENTION

These and other objectives are achieved in a data terminal or computer input device which employs a matrix of ohmic "touch" contacts, together with logically controllable touch-responsive circuitry. Scanning and encoding circuitry is provided for scanning the matrix and for providing a digitally encoded signal that designates which specific ohmic contact has been touched. In an alpha-numeric mode, each such contact represents a certain character. In a graphic mode, the user "draws" a pattern by moving his finger or a stylus over the matrix panel of ohmic contacts. The consecutively generated coded signals, indicating which contacts have been touched in order to "draw" to the pattern, are interpreted by the data processor to recognize the pattern.

The data terminal advantageously employs a novel touch-responsive circuit that is selectively enabled or disabled by a logically controllable impedance element. In the circuit, each ohmic contact is connected via a dc blocking capacitor to the high impedance input of an amplifier. The capacitor and amplifier input are shunted by the controllable impedance element. When the element is in a high impedance state, a weak voltage induced by touching the ohmic contact is supplied to the amplifier, which in turn produces an output signal indicating that the contact has been touched. If the controllable element is in the low impedance state, the weak signal is shunted to ground, and does not reach the amplifier input. No output signal is produced even though the contact has been touched. The weak voltage is derived from the electromagnetic environment or elsewhere.

In the data terminal, a plurality of such ohmic contacts are mounted in matrix array on a panel. All of the contacts in each row are connected via individual dc blocking capacitors to the input of a common amplifier associated with that row. The amplifier outputs are supplied to a priority encoder which produces an digitally encoded signal designating the row containing the ohmic contact that has been touched.

The controllable impedance elements associated with all of the ohmic contacts in each matrix column are connected to a common column-enabling line. These lines are sequentially or randomly scanned, so that only the ohmic contacts in one column at a time are enabled. A digitally encoded signal is obtained that designated the enabled column. This, together with the now-designating signal from the priority encoder, is stored in a latch, the contents of which uniquely identifies which contact has been touched. This contact identification code may be provided to the associated data processing equipment under CPU control.

BRIEF DESCRIPTION OF THE DRAWINGS

A detailed description of the invention will be made wih reference to the accompanying drawings wherein like numerals designate corresponding parts in the several figures.

FIG. 4 is an electrical schematic diagram of a matrix of touch-responsive circuits that is advantageously employed in the data terminal of FIG. 1.

FIG. 5 is an electronic block diagram of a scanning and encoding system employing the touch-responsive circuit matrix of FIG. 4.

FIG. 6 is an electrical schematic diagram of a touch-responsive circuit like FIG. 2, but employing an active electronic device as the controllable impedance element.

FIGS. 7 and 8 are electrical schematic diagrams of alternative circuits like FIG. 6, each using a transistor as the controllable impedance element.

FIG. 9 is an electrical schematic diagram of a touch responsive circuit in which a voltage is supplied to one of a pair of touch contacts.

DESCRIPTION OF THE PREFERRED EMBODIMENT

The following detailed description is of the best presently contemplated modes of carrying out the invention. This description is not to be taken in a limiting sense, but is made merely for the purpose of illustrating the general principles of the invention since the scope of the invention is best defined by the appended claims.

Operational characteristics attributed to forms of the invention first described also shall be attributed to forms later described, unless such characteristics obviously are inapplicable or unless specific exception is made.

Figure 1:
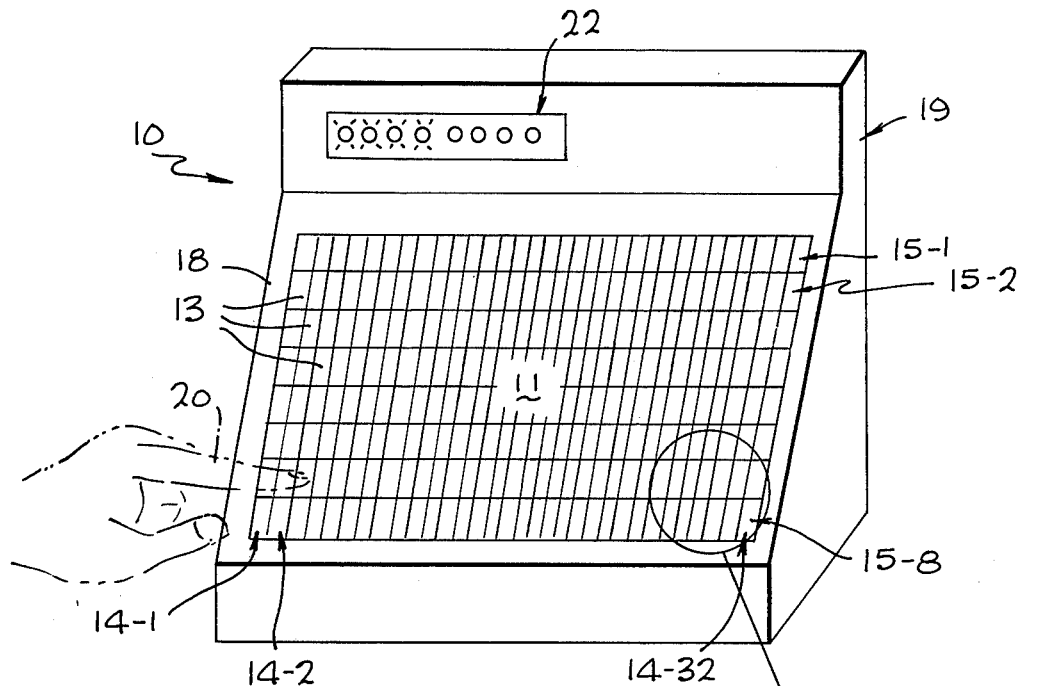
FIG. 1 is a pictorial view of a data terminal or computer input device in accordance with the present invention.

Referring to FIG. 1, there is shown a data terminal or computer input device 10 employing a matrix 11 of touch-responsive circuits 12 (FIG. 2) in accordance with the present invention. In the typical embodiment shown, the matrix 11 includes 256 individual ohmic contacts 13 arrayed in 32 columns 14-1 through 14-32 and eight rows 15-1 through 15-8. The individual ohmic contacts 13 each may comprise a small conductive plate, these plates being supported by a platic grid 16 having an array of openings, surfaces or recesses 17 that receive the individual contacts 13. The dimensions of each ohmic contact 13 are completely arbitrary, but typically may range from a fraction of an inch to several inches in length and/or width.

The contact-support grid 16 advantageously is mounted on the front panel 18 of a housing 19 which may also contain the electrical circuitry associated with the touch contact matrix 11. Such circuitry, described below in conjunction with FIGS. 4 and 5, advantageously scans the matrix 11 to ascertain whether any ohmic contact 13 has been touched, as by the finger 20 of a user. The circuitry of FIGS. 4 and 5 produces a binary-coded digital signal uniquely identifying the specific contact 13 which has been touched. This signal may be provided via a cable 21 to an associated computer or other utilization device. The actuated-contact-identification code also is displayed on the terminal 10 by a set of lamps 22.

Figure 2:
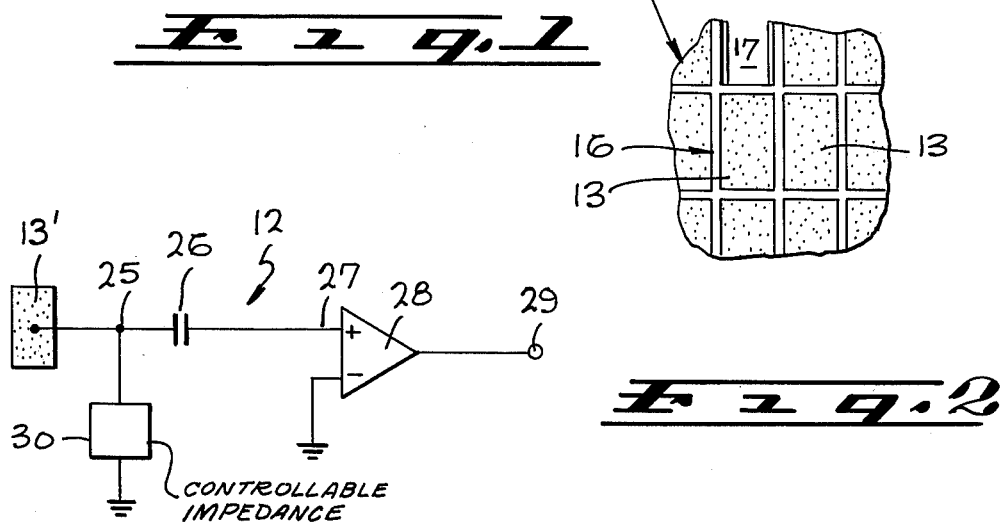
FIG. 2 is a simplified electrical diagram showing the basic logically controllable, touch-responsive circuit of the present invention.

The basic touch-responsive circuit 12 is shown in FIG. 2. An individual ohmic contact 13' is connected via a terminal 25 and a dc blocking capacitor 26 to a high impedance input terminal 27 of an amplifier 28. In the embodiment shown, the terminal 27 is the non-inverting (+) input of an operational amplifier commercially available as an integrated circuit chip. The amplifier inverting (−) input terminal is grounded.

The terminal 25 also is connected to ground via a logically controllable impedance element 30. The element 30 has the characteristic of selectively exhibiting either a high impedance or a low impedance. Illustrative embodiments of the controllable impedance element 30 are shown in FIGS. 3 and 6-9.

When a perseon touches the ohmic contact 13', the small voltage induced in his person by electromagnetic fields present in the environment is conducted via the capacitor 26 to the high impedance input terminal 27 of the amplifier 28, assuming that the controllable impedance element 30 is in a high impedance state. The gain of the amplifier 28 is sufficient to amplify the weak induced voltage (typically between about 50 millivolts and about 1 volt) to a level applicable for use in standard integrated circuit of transistor logic. Thus the amplifier 28 may produce at a terminal 29 an output signal of say 5 volts, which "high" signal indicates that the contact 13' has been touched.

In the event that the controllable impedance element 30 is in a low impedance state, the weak voltage from the ohmic contact 13' will be shunted to ground via the element 30. In this case, the amplifier input terminal 27 will remain near ground potential, so that a low output is obtained at the terminal 29 even when the ohmic contact 13' is touched. That is, conditioning of the element 30 to the low impedance state will disable the touch-responsive circuit 12.

The selective contact enabling capability of the controllable impedance element 30 is utilized to accomplish scanning of the contact matrix 11 in the data terminal 10. The basic principle of such scanning is illustrated by the circuit 32 of FIG. 3. Here, too, ohmic contacts 13a, 13b both are connected via respective blocking capacitors 26a, 26b to the input terminal 27' of a single operational amplifier 28'. The controllable impedance element 30a associated with the contact 13a comprises a pair of diodes 33a, 34a connected in series between an enabling line 35 and a line 36 which leads to ground via a resistor 37. Similarly, the controllable impedance element 30b associated with the contact 13b comprises a pair of diodes 33b, 34b connected in series between an enabling line 38 and the line 36.

The lines 35 and 38 are driven by respective NAND gates 39 and 40. Normally, the enable inputs 41, 42 to these gates 39, 40 are low so that a high signal is present on each of the lines 35 and 38. For typical TTL integrated circuitry, this signal level will be greater than +2.4 volts. This voltage is above the typical level of 1.4 volts (about 0.7 volts per diode) required to force current in the forward direction through a pair of series connected diodes. Thus, forward current will flow from the line 35 via the diodes 33a, 34a, the line 36 and the resistor 37 to ground. The diodes 33a, 34a both will be forward biased, and hence the diodes 33a, 34a will exhibit a low impedance that effectively shorts the terminal 25a to ground. Similarly, current flow from the line 38 through the diodes 33b, 34b and the resistor 37 will forward bias the diodes 34b, 33b so that they exhibit a low impedance. This effectively shorts the junction 25b to ground. As a result, both of the ohmic contacts 13a and 13b will be disabled. That is, if either of these contacts is touched, the small induced voltage will not reach the amplifier input terminal 27' but will be effectively shunted to ground via the low impedance of the respective diodes 33a, 34a or 33b, 34b. As a result, the output of the amplifier 28' will remain low and there will be no true output signal at the terminal 29'.

If true signals are applied to either of the control gates 39, 40, the corresponding touch contact 13a or 13b will be enabled. For example, if an enabling signal is applied to the gate 39 and the gate 40 remains unqualified, the line 38 will be high so as to forward bias the diodes 33b and 34b as described above. The contact 13b is disabled. With a conventionl TTL gate 40, the signal on the line 38 will be at least 2.4 volts. The combined voltage drop across the forward biased diodes 33b, 34b is about 1.4 volts, and the different (about 1 volt) appears across the resistor 37. That is, the current flow through the diodes 33b, 34b biases the line 36 to about 1 volt.

Since a qualifiying signal is present at the gate 39, the line 35 is low i.e., has a voltage of less than about 0.4 volts for a TTl gate 39. Since the line 36 is at approximately +1 volt, the diodes 33a and 34a are reverse biased. As a result, the diodes 33a and 34a exhibit a very high impedance. If the ohmic contact 13a now is touched, the small induced voltage is supplied via the capacitor 26a to the input terminal 27' of the amplifier 28'. A high signal, indicative of contact actuation will be present at the output terminal 29'. In this manner, the selective application of a qualifying signal at the gate 39 or a low signal at the line 35 will enable only the ohmic contact 13a. Alternatively, the application of a qualifying signal at the gate 40 or a low signal at the terminal 38 will selectively enable the contact 13b. Note that the forward biased diode pair 33a, 34a (or 33b, 34b) isolates the associated contact 13a (or 13b) even when an ac voltage is introduced by touching the contact. On alternative half cycles of the ac, the voltage will be conducted to ground via one or the other of the diodes 33a, 34a (or 33b, 34b).

Figure 3:
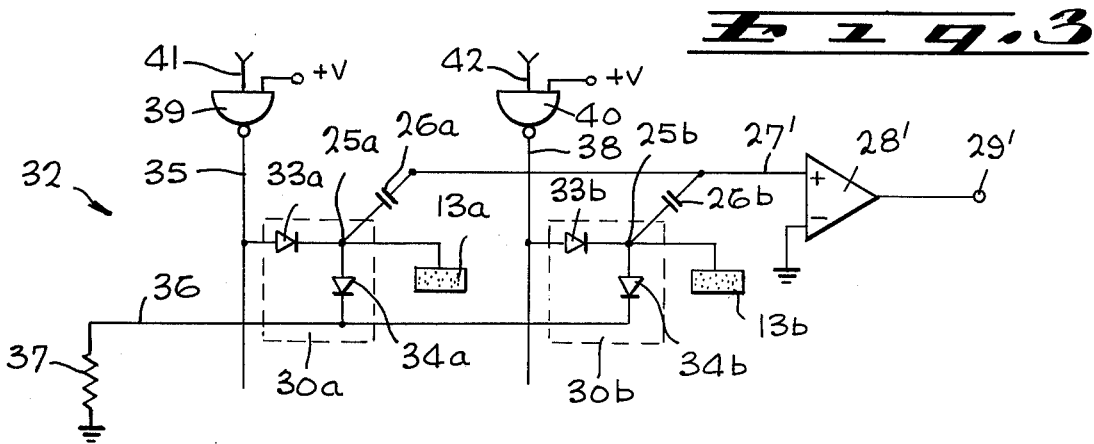
FIG. 3 is an electrical schematic diagram illustrating how a pair of the inventive touch-responsive circuits may be selectively enabled.

The principles illustrated in FIG. 3 advantageously are employed for scanning the contact matrix 11 (FIG. 1) using the illustrative circuitry of FIG. 4. Referring thereto, the matrix circuitry 11' incorporates a plurality (herein thirty-two) of column-enabling lines 45-1, 45-2 . . . 45-32. Appropriate selection circuitry such as the decoder 46 (FIG. 5) is used to maintain all but one of the lines 45-1 through 45-32 at a high (greater than 2.4 volt) level. The one selected line is held at a low (less than 0.4 volt) column-enabling level. A plurality (herein eight) touch contacts 13, each with its associated controllable impedance element 30 and dc blocking capacitor 26, are associated with each column-enabling line 45-1 through 45-32. For example, two of the eight contacts associated with the line 45-1 are shown in FIG. 4. These are designated contacts 13-1 and 13-2, and have associated capacitors 26-1, 26-2 and controllable impedance elements 30-1 and 30-2. In the embodiment of FIG. 4, there are eight rows of contacts 13. All of the contacts 13 in each row are connected via their associated blocking capacitors 26 to a common amplifier 28. For example, all of the contacts 13-1, 13-9 . . . 13-249 in the top row 15-1 are connected via the respective capacitors 26-1, 26-9 . . . 26-249 and a common line 47-1 to the input terminal 27-1 of an amplifier 28-1. In the circuit shown, the amplifier 28-1 is implemented using one of the two operational amplifiers supplied in a single type μA 747 integrated circuit chip. The gain of the amplifier 28-1 is established by a set of resistors 48-1 through 51-1 connected as shown. All of the controllable impedance elements 30-1, 30-9 . . . 30-249 in the first row of the matrix 11 are connected via a common line 36-1 and a resistor 37-1 to ground.

This arrangement functions in the manner described in connection with FIG. 3 to provide a high signal at the output terminal 29-1 only upon touching of the ohmic contact that is situated in the row 15-1 and in the single selected column.

Similarly, for the second row 15-2, the contacts 13-2, 13-10 . . . 13-250 are connected via the respective capacitors 26-2, 26-10 . . . 26-250 and a line 47-2 to the input terminal 27-2 of an amplifier 28-2. The gain of the amplifier 28-2 is controlled by a set of resistors 48-2 through 51-2. The controllable impedance elements 30-2, 30-10 . . . 30-250 are connected via a common line 36-2 and a resistor 37-2 to ground. Again, a high signal is present at the output line 29-2 only upon touching of the single ohmic contact 13 in the row 15-2 at the single enabled column.

For example, if the last column 14-32 is selected, only the line 45-32 will be low and the other lines 45-1 through 45-31 will be high. In this instance, a high signal will appear at the output line 29-1 if the contact 13-249 is touched, but such signal will not occur if any of the other contacts in row 15-1 are touched. Similarly, the line 29-2 will provide a high output if the contact 13-250 is touched, but not if any of the other contacts in row 15-2 are touched.

A system 50 for scanning the touch contact matrix 11 is shown in FIG. 5. In this system, the matrix 11 utilizes the circuitry 11' of FIG. 4.

Column scanning is accomplished by an oscillator 51 which drives a scale-of-32 counter 52. The output of the counter 52 is a 5-bit parallel signal corresponding to the sequential binary codes for the values 0 through 31 inclusive. This signal is supplied via a conduit 53, consisting of five parallel lines, to a 5-to-32 line decoder 46. The decoder 46 provides a high signal to all but one of the lines 45-1 through 45-32. That one line which receives a low signal is determined by the contents of the counter 52 as supplied on the conduit 53. For example, if the counter 52 contents is "2" so that the supplied binary code is 000010, then the decoder 46 provides a low output to the second column-enabling line 45-2. The decoder 46 advantageously may be implemented using a pair of 4-to-16 line decoder integrated circuit chips such as the Texas Instruments type 74154. The most-significant bit of the signal from the counter 52 then may be used alternatately to enable one or the other of these two 16-line decoders.

Row-encoding of the contact matrix 11 may be accomplished by an 8-line to 3-line priority encoder 55. Such an encoder 55 provides on a conduit 56 a 3-bit parallel signal that is binary coded to designate which one of the outputs 29-1, 29-2 . . . 29-8 has a output signal indicative of actuation of a touch contact in the corresponding row 15-1 through 15-8. If the touch contacts in more than one row in the enabled column are touched simultaneously, the priority encoder 55 will only encode that one nearest to the bottom row 15-8 (or alternatively, nearest to the top row 15-1) in the matrix 11.

The priority encoder 55 may be implemented using an 8-to-3 line encoder integrated circuit chip of the type 74148 manufactured by Texas Instruments. This particular IC chip encodes an active low signal, so that when employed in the circuit 50 of FIG. 5, inverters (not shown) should be utilized in each of the lines 29-1 through 29-8 and in each of the three lines in the conduit 56.

The unique column and row position of the actuated touch contact in the matrix 11 is designated by the 8-bit code present on the combined lines of the conduits 53 and 56. The five bits on the conduit 53 designate the column, and the three bits on the conduit 56 designate the row. This contact-indicating code advantageously is stored in a latch 57 that is loaded with the code upon occurrence from the encoder 55 of a signal indicating that at least one contact-actuation signal has been received from the matrix 11. This signal is produced on a line 58 and triggers a monostable multivibrator (one-shot) 59 that produces a LOAD signal on a line 60. This signal causes the latch 57 to enter the data from the conduits 53 and 56, so that the latch 57 now contains the contact-indicating code. This data can be supplied on an 8-bit parallel output conduit 21 upon occurrence of a "read-out" pulse on a line 61. That signal, e.g., may be provided by a computer for which the data terminal 10 is used as an input device. For example, the signal on the line 61 may comprise a matrix address decode signal from the computer central processing unit. The conduit 21 then may be connected to the computer CPU data buss.

The contact-identification code on the conduit 21 also may be displayed on the lamps 22. To this end, each of the lamps 22 may comprise a light emitting diode 22-1 through 22-8 (FIG. 5). Each LED is connected from a respective one of the lines in the conduit 21 through a respective resistor 62-1 through 62-8 to ground. With this arrangement, when the latch read-out signal on the line 61 occurs, the contact identification code will be displayed on the lamps 22.

The latch 57 may be implemented using a pair of Texas Instruments type 74173 4-bit latch integrated circuits. The load signal on the line 58 may be obtained from the encoder integrated circuit chip 74148, and provided via a one-shot 59 to the "clock" input of the 74173 chips.

Referring to FIG. 6, the logically controllable impedance element 30 (FIG. 2) may comprise an active electronic device 30'. For example, the element 30' may comprise a bipolar transistor or a field effect transistor. In general, the element 30' has three terminals, a "qualifier node" 65 that is connected to the column-enabling line 45, an "input node" 66 that is connected to the ohmic contact 13, and an "output node" 67 that is connected via a junction 25' and the capacitor 26 to the amplifier 28. The active electronic device 30' also is supplied via a resistor 68 to a voltage source of appropriate polarity connected to a terminal 69.

The active device 30' may be connected in either series or parallel configuration, as illustrated respectively by the circuits of FIGS. 7 and 8. In FIG. 7, a field effect transistor 71 is employed. The contact 13 is connected to the gate which here functions as the input node 66'. The source and drain of the FET 71 function interchangeably as the qualifier node 65' and the output node 67'. When the line 45 is enabled (by dropping from a positive voltage to near ground potential), the transistor 71 is turned on. The weak induced voltage present when the contact 13 is touched is amplified by the FET 71 and supplied via the capacitor 26 to the amplifier 28 so as to produce the output signal at the line 29 indicative of contact actuation. A bipolar transistor (not shown) may be used in place of the field effect transistor 71. In such instance, the base would be connected to the ohmic contact 13, and the collector and emitter would be connected alternatively as either the qualifier and output nodes, with the appropriate polarity voltage being supplied at the terminal 69.

Parallel connection of the active electronic device 30' is illustrated in FIG. 8. There, a bipolar transistor 73 is connected from the junction 25' to ground. The base of the transistor 73 is connected to the column-enabling line 45 as the qualifier node. In this arrangement, the transistor 73 normally must be "on", and this is the situation when the signal on the line 45 is high. In this conducting state, the ohmic contact 13 effectively is grounded, and thus disabled. When the line 45 goes low, the transistor 73 goes off and thus appears as a high impedance. Under this condition, touching of the ohmic contact 13 will cause the amplifier 28 to provide a high signal indicative of contact actuation. A field effect transistor (not shown) may be used in place of the bipolar transistor 73 in the circuit of FIG. 8.

In any of the embodiments described above, an output signal is obtained when an enabled ohmic contact is touched. Such touching may be accomplished either by the finger or other part of the human anatomy or by some other item, such as a pencil, which acts as an antenna to pick up electromagnetic fields from the environment. In the case of a pencil, the graphite acts as the antenna, and enough voltage is induced from the environmental electromagnetic fields to provide sufficient input via the capacitor 26 to cause the amplifier 28 to produce an output indicating that the contact has been touched.

The data terminal 10 may be used in either an alphanumeric or interpretive mode. In the former, each individual ohmic contact 13 on the panel 18 (FIG. 1) would represent a different alphabetic, numeric or symbolic character. In this mode, the data terminal 10 would take the place of a conventional teletypewriter or other keyboard input device.

In an "interpretive" mode, appropriate software may be used in the associated computer to interpret the path of locii of consecutively touched contacts 13. This mode may be used, e.g., for handwriting or graphic input purposes. For example, the operator may use a finger, a pencil, or other appropriate stylus (which functions as an antenna as described above), to touch a recognizable sequence of contacts in the matrix 11. Such sequence may, e.g., resemble words in English or other language, mathematical terms and symbols, or graphical designs. By scanning the matrix 11 at an appropriately rapid rate, the consecutive points will be supplied to the associated computer in the form of consecutive matrix location identification codes. Interpretive software in the computer then will recognize the pattern and perform the intended computational functions. For use as such a graphic input device, it is preferable that each of the contacts 13 be of small dimension so as to obtain optimum resolution of the graphic pattern described on the panel 18. Moreover, a separate display panel (not shown) may comprise a set of lamps arranged in one-to-one correspondence to the matrix arrangement of the contacts 13. These lamps can be illuminated as each corresponding contact in the matrix 11 is touched, so as to present an optical display corresponding to the graphical pattern outlined by the finger or stylus on the matrix 11.

In the touch-responsive circuit of FIG. 9, the ohmic contact 13t is small in size and is situated adjacent another small contact 80 which is connected to a voltage terminal 81. When both contacts 13t, 80 are simultaneously touched, a voltage from the terminal 81 is conducted via the person's finger to the ohmic contact 13t. Operation thereafter is identical to that of FIG. 2. By providing this voltage source, operation does not depend on a voltage being picked up from the environment. Therefore, the circuit of FIG. 9 is particularly applicable for areas where the environmental electromagnetic levels are low. In an alternative embodiment, not shown, the dc blocking capacitor 26 (FIG. 2) may be eliminated by biasing the operational amplifier 28 to compensate for or null-balance the dc voltage used by the controllable impedance 30.

In another alternative embodiment, not shown, the resistors 37-1 through 37-8 may be replaced by reference voltage sources such as zener diodes. Intending to claim all novel, useful and unobvious features, shown or described, the inventor:

I claim:

1. A touch-responsive circuit, comprising:
    an ohmic contact,
    an amplifier having a high impedance input,
    a dc blocking capacitor, said contact being connected via said capacitor to said amplifier high impedance input, so that a small voltage induced by touching said contact will be supplied to said amplifier causing production of an amplifier output signal indicative of touch actuation, and
    a controllable impedance element connected to said contact and selectively controlled to permit or prevent said induced voltage from being supplied to said amplifier depending on the effective impedance of said element, control of said element thereby selectively enabling output signal actuation by human touching of the associated ohmic contact.

2. A touch-responsive circuit according to claim 1, wherein said controllable impedance element comprises:
    a pair of diodes connected in series, the junction of said diodes being connected to the junction of said ohmic contact and said capacitor so that said diodes effectively shunt said capacitor and said amplifier input, and
    control means for selectively, alternatively reverse biasing or forward biasing said series connected diodes, said diodes exhibiting high impedance when reverse biased and exhibiting low impedance when forward biased, whereby when forward biased said shunting diodes prevent said induced voltage from being supplied to said amplifier.

3. A touch-responsive circuit according to claim 2 comprising:
    one or more additional ohmic contacts,
    a like number of additional dc blocking capacitors, each of said additional ohmic contacts being connected via a respective one of said additional capacitors to the same high impedance input of said amplifier,
    a like number of additional series-connected pairs of diodes, the junction of each additional diode pair being connected to a respective junction between a respective additional ohmic contact and capacitor,
    a separate controllable voltage source connected to one end of each diode pair, a selectable one of said voltage sources being conditioned to reverse bias the associated diode pair, all others being conditioned to forward bias the associated diode pair,
    a common line connecting the other end of all said diode pairs, and
    a resistor connecting said common line to the return of all said voltage sources, whereby all of said diode pairs are forward biased except that pair associated with the selected one voltage source, so that only touching of the ohmic contact connected to that one diode pair associated with said selected one voltage source will cause said amplifier to provide said output signal indicative of touch actuation.

4. A touch-responsive circuit according to claim 2 wherein one end terminal of said diode pair is connected to ground, and wherein said control means comprises:
    a switchable source of voltage connected to the other end terminal of said diode pair in the direction of forward current flow through both of said diodes, turn-on of said source of voltage disabling output signal actuation by touching of the associated ohmic contact, and
    wherein additional like-connected ohmic contacts, capacitors, amplifiers and diode pairs are connected to the same switchable voltage source, so that turn-off of said switchable voltage source enables all of said ohmic contacts having diode pairs connected thereto.

5. A touch-responsive circuit according to claim 1 wherein said amplifier comprises an operational amplifier, said capacitor being connected to the input of said amplifier, said controllable impedance element comprising a pair of diodes connected in series in the current flow direction, the junction of said pair of diodes being connected to the junction of said capacitor and said ohmic contact, one end of said pair of diodes being connected to a voltage reference via a resistor, together with a transistor driver circuit connected to supply a voltage to the other end of said pair of diodes, said voltage being greater than the combined forward voltage drop across said pair of diodes and of a polarity to cause forward current flow through said diodes, supply of voltage from said driver circuit thereby causing the impedance of said diodes to drop to a low value so as to shunt to ground the small voltage induced by touching said contact, thereby disabling output signal actuation by said touching.

6. A touch-responsive circuit according to claim 1 wherein said controllable impedance element comprises an active electronic device.

7. A touch-responsive circuit according to claim 6 wherein said controllable impedance element is a transistor, said ohmic contact being connected to the control terminal of said transistor, the other two terminals of said transistor being connected between said capacitor and a line on which a control signal is alternatively present or absent.

8. A touch-responsive circuits according to claim 6 wherein said controllable impedance element is a transistor, one non-control terminal of said transistor being connected to the junction between said ohmic contact and said capacitor, the other transistor non-control terminal being connected to ground, and a control circuit for selectively applying a signal to the control terminal of said transistor to turn said transistor on, in which case the effective impedance of said element is low so that said induced voltage is prevented from being supplied to said amplifier, or off, in which case the element effective impedance is high and said induced voltage is supplied to said amplifier.

9. A touch-responsive circuit according to claim 1 further comprising:
 a second ohmic contact situated adjacent to the aforementioned ohmic contact, and
 a voltage source connected to said second contact, said contacts being in sufficiently close proximity to permit simultaneous touching thereof, whereby voltage from said source is by such touching conducted from said second contact to said aforementioned ohmic contact.

10. A data terminal comprising:
 a plurality of ohmic contacts arranged in a matrix of rows and columns,
 an amplifier associated with each row, each ohmic contact in each row being connected via a respective capacitor to the input of the amplifier for that row,
 a column-enabling line associated with each column,
 a resistor associated with each row,
 a pair of diodes associated with each ohmic contact and connected in series between each column-enabling line and each row-associated resistor, the between-diode junction of each diode pair being connected to the associated ohmic contact, human touching of an ohmic contact causing a voltage to reach the amplifier in the row containing that touched contact unless the associated diode pair is forward biased so as to shunt said touch-caused voltage to ground, and
 a voltage source connected to each column-enabling line, each voltage source being of a polarity and level sufficient to forward bias all of the diode pairs connected to the associated column-enabling line, all but one of said voltage sources being on, a selectable one of said voltage sources being off, whereby human touching of an ohmic contact in the column associated with said selected turned-off voltage source will cause a voltage to reach the amplifier in the associated row, that amplifier thereby producing a signal indicating that the ohmic contact has been touched.

11. A data terminal according to claim 10 further comprising:
 a priority encoder, connected to the outputs of said amplifiers and responsive to occurrence of an indicating signal from one of said amplifiers, for providing a digitally encoded signal designating which row contains that ohmic contact touching of which caused production of said indicating signal,
 column scanning means for turning off each of said voltage sources in sequence, and thereby sequentially enabling each column of ohmic contacts, and
 column encoding means, connected to said scanning means, for providing a digitally encoded signal designating the column containing the enabled ohmic contacts.

12. A data terminal according to claim 11 further comprising:
 a latch connected to store both the row-designating signal from said priority encoder and the column-designating signal from said column encoding means, data input to said latch being enabled upon occurrence of a touch-indicating signal from any of said amplifiers.

13. A data terminal according to claim 10 together with display light means for providing a visual indication identifying those ohmic contacts touching of which has caused production of indicating signals from said amplifiers.

14. A data terminal according to claim 10 wherein said resistor associated with each row is replaced by a reference voltage source for each row.

15. A touch-responsive circuit, comprising:
 an ohmic contact,
 an amplifier having a high impedance input, said contact being connected to said amplifier high impedance input so that a small voltage induced by human touching said contact will be supplied to said amplifier and cause production of an amplifier output signal indicative of touch actuation,
 a controllable impedance element connected to said contact and selectively controlled to permit or prevent said induced voltage from being supplied to said amplifier depending on the effective impedance of said element, said effective impedance being controlled by a dc control voltage applied to said element, control of said element thereby selectively enabling output signal actuation by touching of the associated ohmic contact, and
 means for preventing a dc component of the control voltage from biasing said amplifier.

16. A touch-responsive circuit according to claim 15 wherein said amplifier is an operational amplifier, and wherein said means for preventing is selected from the group consisting of a dc blocking capacitor connected betweenin said controllable impedance and said amplifier, and biasing means for biasing said amplifier to null-balance said dc component.

* * * * *